US009088258B2

(12) United States Patent
Ichitsubo et al.

(10) Patent No.: US 9,088,258 B2
(45) Date of Patent: *Jul. 21, 2015

(54) RF POWER AMPLIFIER WITH LINEARITY CONTROL

(75) Inventors: Ikuroh Ichitsubo, Kanagawa Prefecture (JP); Masaya Kuwano, Kanagawa Prefecture (JP); Koshiro Matsumoto, Tokyo (JP)

(73) Assignee: Micro Mobio Corporation, Palo Alto, CA (US)

( * ) Notice: Subject to any disclaimer, the term of this patent is extended or adjusted under 35 U.S.C. 154(b) by 493 days.

This patent is subject to a terminal disclaimer.

(21) Appl. No.: 12/776,216

(22) Filed: May 7, 2010

(65) Prior Publication Data

US 2010/0219887 A1  Sep. 2, 2010

Related U.S. Application Data

(63) Continuation-in-part of application No. 12/013,734, filed on Jan. 14, 2008, now Pat. No. 7,741,904.

(51) Int. Cl.
*H04B 1/04* (2006.01)
*H03G 3/30* (2006.01)

(52) U.S. Cl.
CPC .................................. *H03G 3/3036* (2013.01)

(58) Field of Classification Search
USPC ............ 455/114.3, 127.3, 501, 67.11, 67.13, 455/67.14, 67.16, 68, 69, 114.1, 114.2, 455/115.1–115.4, 116, 127.2, 127.1; 330/133, 310, 295, 296, 124 R, 302, 330/285, 129, 51, 52; 375/376

See application file for complete search history.

(56) References Cited

U.S. PATENT DOCUMENTS

| 4,977,041 | A | 12/1990 | Shiozawa |
| 5,656,972 | A | 8/1997 | Norimatsu |
| 5,880,635 | A | 3/1999 | Satoh |
| 6,025,651 | A | 2/2000 | Nam |
| 6,151,509 | A | 11/2000 | Chorey |
| 6,262,630 | B1 | 7/2001 | Eriksson |
| 6,462,622 | B1 | 10/2002 | Mori |
| 6,625,050 | B2 | 9/2003 | Suwa |
| 6,678,506 | B1 | 1/2004 | Dolman |
| 6,798,287 | B2 | 9/2004 | Wu |
| 2003/0201827 | A1* | 10/2003 | Ohnishi et al. ................ 330/133 |
| 2004/0127185 | A1 | 7/2004 | Abrahams |
| 2004/0203552 | A1 | 10/2004 | Horiuchi |
| 2004/0266371 | A1* | 12/2004 | Summers et al. .......... 455/127.1 |
| 2005/0189990 | A1* | 9/2005 | Mizuta et al. .................. 330/52 |
| 2005/0239415 | A1 | 10/2005 | Sagae |
| 2006/0132232 | A1* | 6/2006 | Baree et al. ..................... 330/51 |
| 2007/0190952 | A1* | 8/2007 | Waheed et al. ............ 455/114.3 |
| 2010/0144286 | A1* | 6/2010 | Sorensen ........................ 455/73 |

* cited by examiner

*Primary Examiner* — Junpeng Chen
(74) *Attorney, Agent, or Firm* — Roark IP

(57) ABSTRACT

A linear amplifier circuit includes a multi-stage power amplifier that can amplify an input signal to produce an output signal, and a gain feedback control circuit coupled with the output and the input of the multi-stage power amplifier. An adjacent-channel leakage feedback control circuit can detect the output signal at the output of the multi-stage power amplifier and reduce adjacent-channel leakage in the output signal over an output power range based on the detected output signal.

23 Claims, 16 Drawing Sheets

RF POWER AMPLIFIER WITH LINEARITY CONTROL

CROSS REFERENCES TO RELATED APPLICATIONS

The present application is a continuation-in-part application of U.S. patent application Ser. No. 12/013,734, titled "Efficient integrated linear amplifier module", filed on Jan. 14, 2008 now U.S. Pat. No. 7,741,904 by the present inventors, the contents of which are incorporated herein by reference.

BACKGROUND

The present invention relates to radio frequency power amplifiers.

Portable devices such as laptop personal computers, Personal Digital Assistant and cellular phones with wireless communication capability are being developed in ever decreasing size for convenience of use. Correspondingly, the electrical components thereof must also decrease in size while still providing effective radio transmission performance. However, the substantially high transmission power associated with radio frequency (RF) communication increases the difficulty of miniaturization of the transmission components.

A major component of a wireless communication device is the power amplifiers (PA). A PA can be fabricated on a semiconductor integrated circuit (IC) chip to provide signal amplification with substantial power. The power amplifier chip can be interconnected with certain off-chip components such as inductors, capacitors, resistors, and transmission lines for operation controls and for providing impedance matching to the input and output RF signals.

One significant challenge for power amplifiers is power consumption. As RF devices are used in longer distances and broader frequencies, the RF devices can consume power at increased rates. Batteries of the RF devices often need to be frequently recharged. Several attempts have been made to improve power amplifiers' power consumption. A power amplifier using so called "Doherty Technique" includes a plurality of serially connected power amplifiers. Another attempt utilizes a number of power amplifiers arranged in a parallel circuit. Another design attempts to reduce power amplifiers' power consumption using quadrature balanced amplifiers. These designs, however, usually cannot provide high quality signals over a wide output power range and a wide frequency range.

SUMMARY

In a general aspect, the present invention relates to a linear amplifier circuit that includes a multi-stage power amplifier configured to amplify an input signal to produce an output signal; and a linearity control circuit that can control the multi-stage power amplifier to reduce adjacent-channel leakage in the output signal.

Implementations of the system may include one or more of the following. The spectrum of the output signal comprises a transmission signal in a transmission channel and ACL in an adjacent channel. The linearity control circuit can produce a correction spectral signal in the adjacent channel to reduce ACL. The linearity control circuit can inject an anti-intermodulation signal in the transmission channel to reduce cancel ACL. The linear amplifier circuit can further include a biasing control circuit configured to control the biasing of the multi-stage power amplifier, wherein the linearity control circuit is configured to control the biasing control circuit to reduce ACL in the output signal. The linearity control circuit can extract adjacent-channel leakage around a transmission signal in the spectrum of the output signal, and to control the multi-stage power amplifier to reduce ACL in the output signal. The linearity control circuit can include a first circuit configured to apply fast Fourier transform (FFT) to the output signal to produce a spectral signal, wherein the spectral signal includes a transmission signal and adjacent-channel leakage next to the transmission signal; a second circuit configured to extract the adjacent-channel leakage in the spectral signal; and a third circuit configured to produce a correction spectral signal in response to the extracted adjacent-channel leakage. The linearity control circuit can include a fourth circuit configured to an inverse fast Fourier transform (IFFT) to the correction spectral signal to produce a correction signal. The linearity control circuit can include a gain control circuit configured to control the multi-stage power amplifier to reduce adjacent-channel leakage in the output signal in response to the correction signal. The linearity control circuit can include a phase control circuit configured to control the multi-stage power amplifier to reduce adjacent-channel leakage in the output signal in response to the correction signal. The linear amplifier circuit can further include a first matching circuit connected to the input of the multi-stage power amplifier. The first matching circuit can send the input signal to the multi-stage power amplifier. The linear amplifier circuit can further include a second matching circuit configured to receive the output signal from the output of the multi-stage amplifier before the output signal is output by the linear amplifier circuit, wherein the linearity control circuit is configured to receive the output signal from the output of the second matching circuit. The multi-stage power amplifier can include a driver amplifier, a power amplifier in serial connection, and an inter-stage matching circuit coupled between the output of the driver amplifier and the input of the power amplifier.

In yet another general aspect, the present invention relates to a linear amplifier circuit, comprising: a multi-stage power amplifier configured to amplify an input signal to produce an output signal; a sensing circuit configured to detect at least one of the power, gain, phase of the output signal and to produce a sensing signal; and a linearity control circuit in communication with the multi-stage power amplifier, wherein the linearity control circuit is configured to reduce, in response to the sensing signal, at least one of gain variations, phase variations, or adjacent-channel leakage in the output signal over an output power range.

Implementations of the system may include one or more of the following. The multi-stage power amplifier can include a driver amplifier and a power amplifier in serial connection, wherein the linearity control circuit is configured to allow gain variations of the power amplifier and gain variations of the driver amplifier to compensate each other. The multi-stage power amplifier comprises a driver amplifier and a power amplifier in serial connection. The linearity control circuit can allow phase variations of the power amplifier and phase variations of the driver amplifier to compensate each other. The driver amplifier can exhibit phase expansion in the output power range, and the power amplifier can exhibit phase compression over the output power range. The driver amplifier can exhibit phase compression in the output power range, and the power amplifier can exhibit phase expansion over the output power range. The linear amplifier circuit can further include a first matching circuit connected to the input of the multi-stage power amplifier, the first matching circuit configured to send the input signal to the multi-stage power amplifier. The linear amplifier circuit can further include a second matching circuit configured to receive the output signal from the output of the multi-stage amplifier before the output signal is output by the linear amplifier circuit. The multi-stage power amplifier can include a driver amplifier and a power amplifier in serial connection. The multi-stage power amplifier can include an inter-stage matching circuit coupled between the output of the driver amplifier and the input of the power amplifier.

Embodiments may include one or more of the following advantages. The disclosed linear amplifier circuits can provide low power consumption. The power level of the RF transmission can be properly controlled to minimize power consumption while providing superior signal quality such as gain linearity. The disclosed linear amplifier circuits can provide excellent output linearity such as error vector magnitude (EVM), adjacent-channel leakage (ACL) and spectrum mission etc. over a wide range of radio frequencies. The high linearity allows high transmission data density in a fixed bandwidth (i.e. higher bits per Hertz). The disclosed linear amplifier circuits can significantly improve the performance of ACL which is known to cause interference with adjacent channels.

The disclosed linear amplifier circuits are suitable to applications in various wireless data and voice communications standards and protocols, including Orthogonal Frequency-Division Multiplexing (OFDM), Orthogonal Frequency-Division Multiplexing Access (OFDMA), Code Division Multiple Access (CDMA), Wideband Code Division Multiple Access (WCDMA), High-Speed Downlink Packet Access (HSDPA), High-Speed Packet Access (HSPA), Long Term Evolution (LTE), 802.16 WiMax, WiBro, 802.11 WiFi, WLAN, and others. The linear amplifier circuits are also suitable for high frequency operations by utilizing Gallium Arsenide Heterojunction Bipolar Transistors (GaAs HBT).

The disclosed linear amplifier circuits can minimize power consumption in accordance with the output power probability distribution specific to the application of the wireless devices. The disclosed linear amplifier circuit can reduce power consumption by using application specificity, dynamic control, and real time feedback. Power consumption can thus be drastically improved comparing to convention power amplifiers.

The disclosed linear amplifier circuits can also provide proper impedance matching for the input and output signals, as well as for the signals at different stages of the amplification. A power amplifier typically operates with high current flowing through the linear amplifier circuit. Non-zero impedance in the circuit can easily induce a voltage, which can inject unwanted noise into the RF system. The disclosed linear amplifier circuits can therefore minimize noise from unwanted signal oscillations.

Another advantage of the disclosed linear amplifier circuits is that the components involved are highly integrated. One or more of the impedance matching circuits, biasing circuit, power division and power combining circuits, Vmode control circuit, power sensing circuit, and power control circuit can be integrated in a single IC chip. The disclosed linear power amplifier module can therefore be compact and has smaller foot print compared to prior art implementations. Bulky components such as switches in some conventional systems are not eliminated in the disclosed PA circuits.

BRIEF DESCRIPTION OF THE DRAWINGS

The following drawings, which are incorporated in and from a part of the specification, illustrate embodiments of the present specification and, together with the description, serve to explain the principles of the specification.

DETAILED DESCRIPTION

Figure 1A:
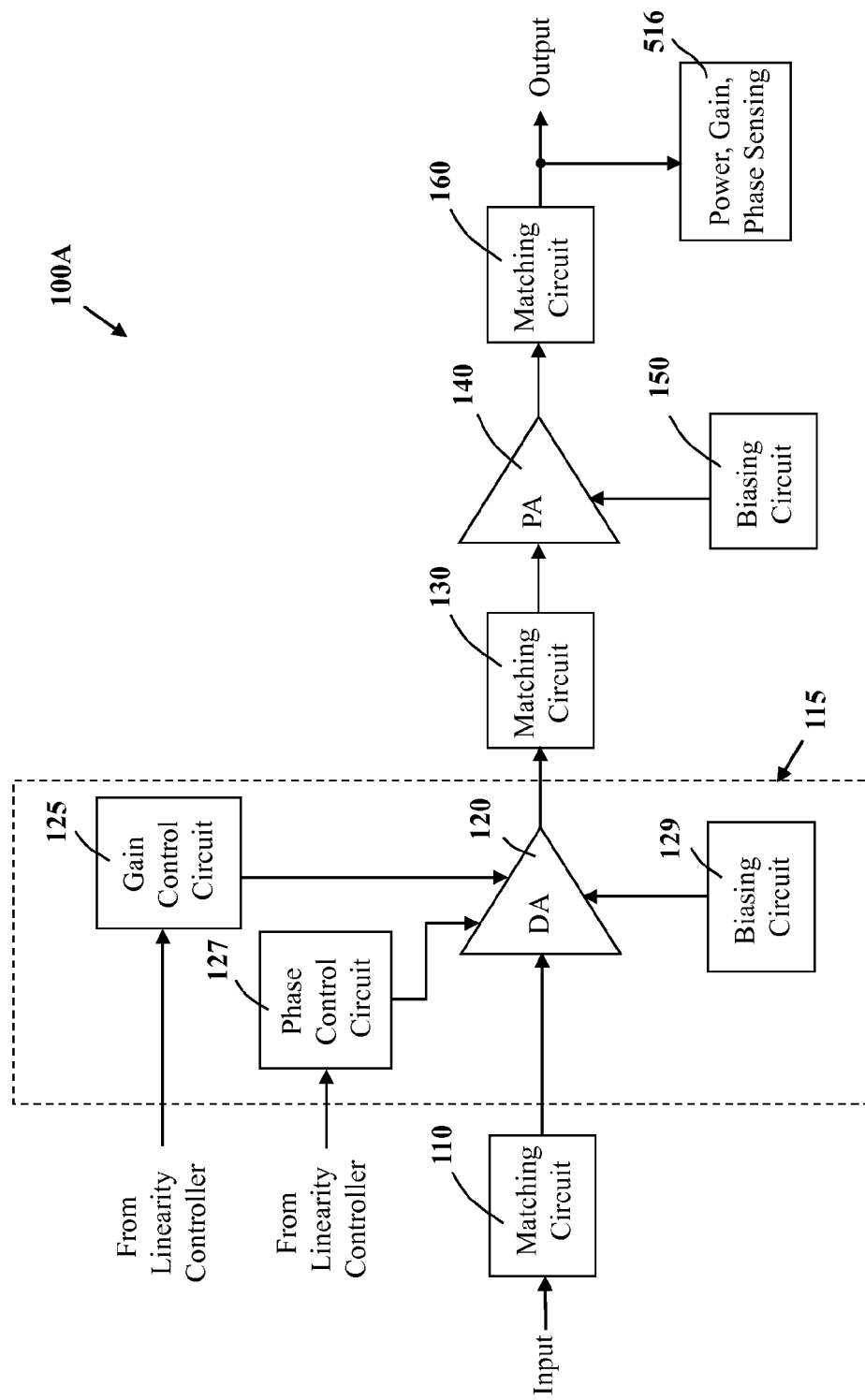
FIGS. 1A-1D are schematic diagrams for power amplifier circuits with linearity controls in accordance to the present invention.
Figure 5A:
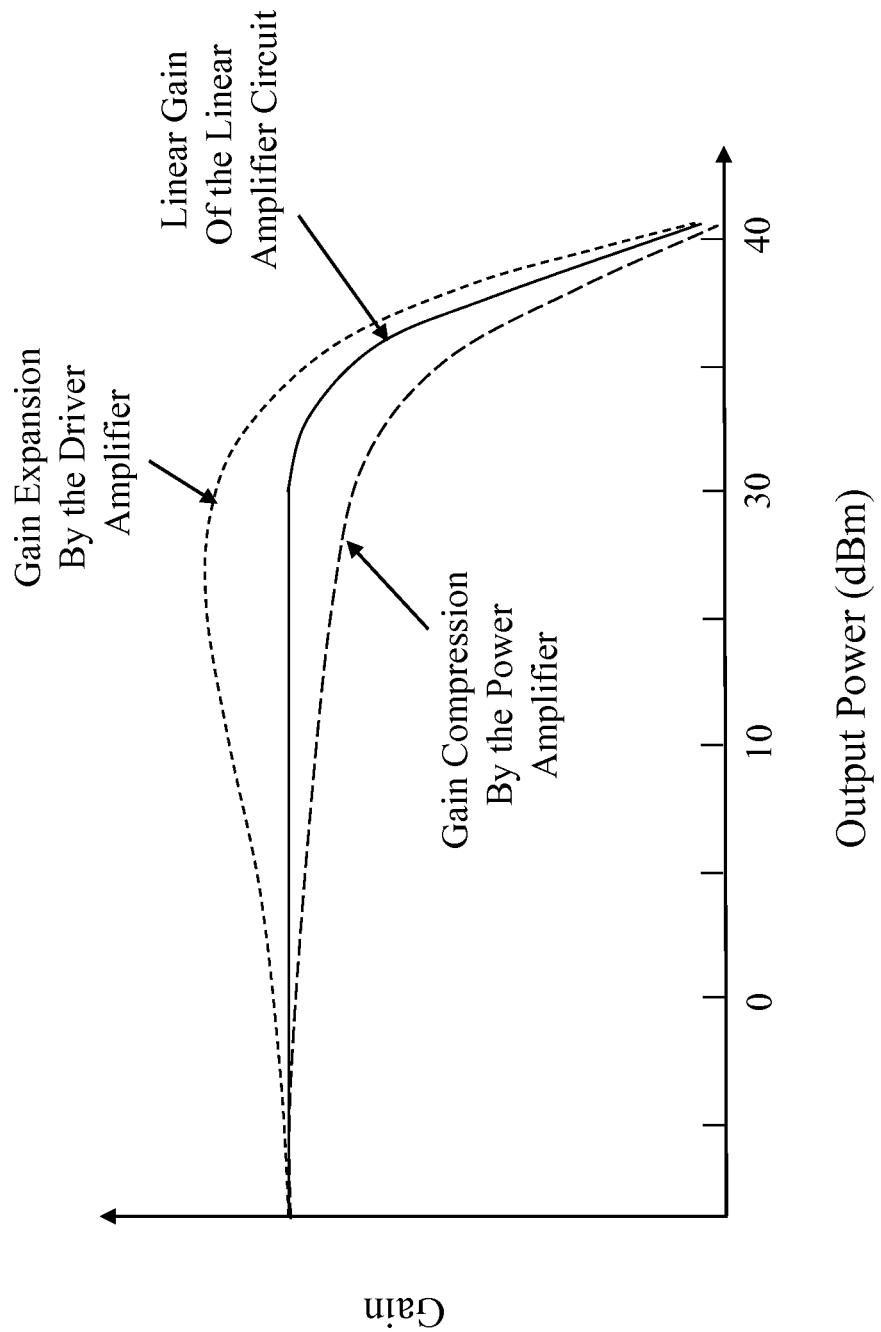
FIG. 5A illustrates an implementation of achieving linear gain using gain compensation in the linear amplifier circuit of FIGS. 1A-3.
Figure 5B:
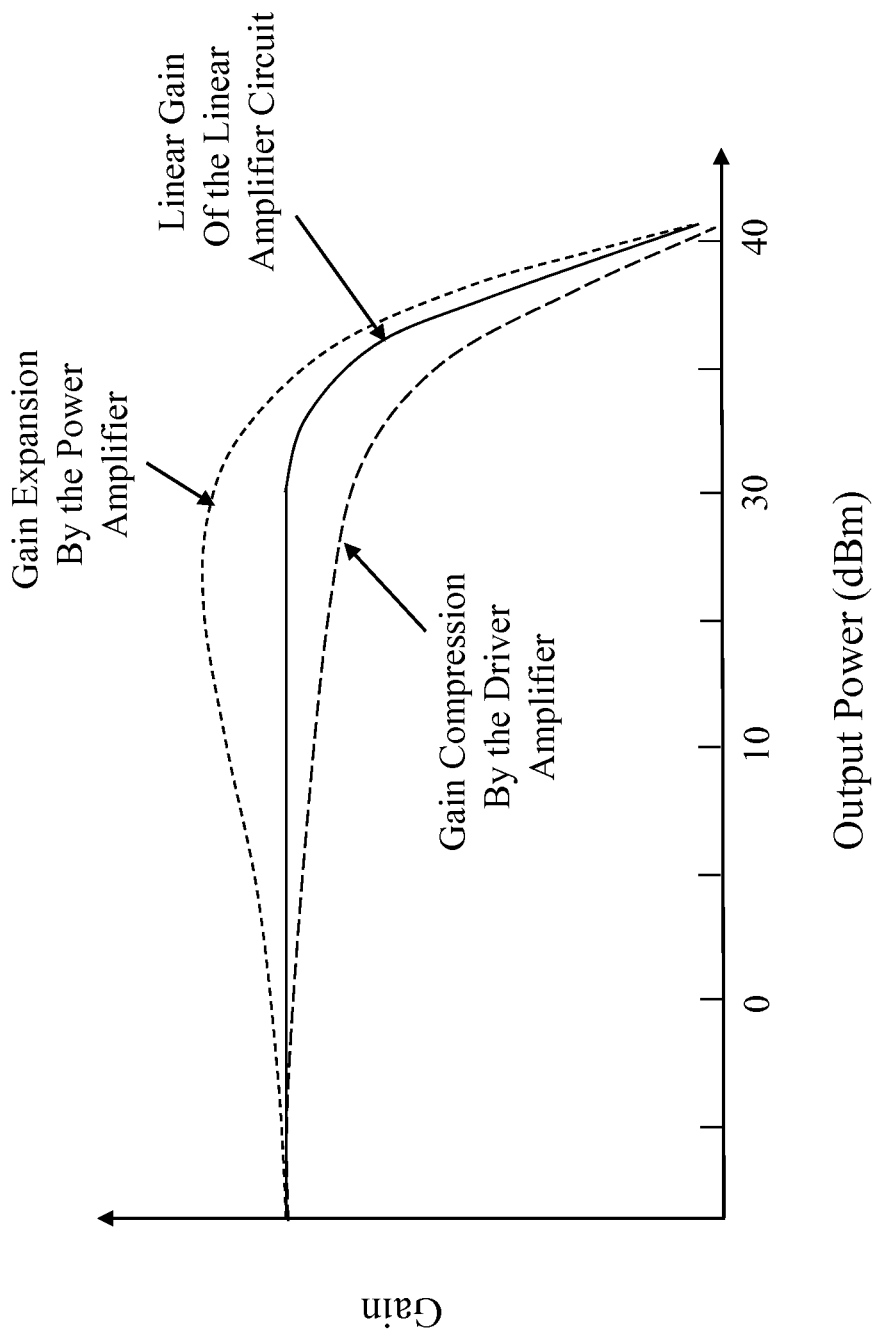
FIG. 5B illustrates another implementation of achieving linear gain using gain compensation in the linear amplifier circuit of FIGS. 1A-3.
Figure 6A:
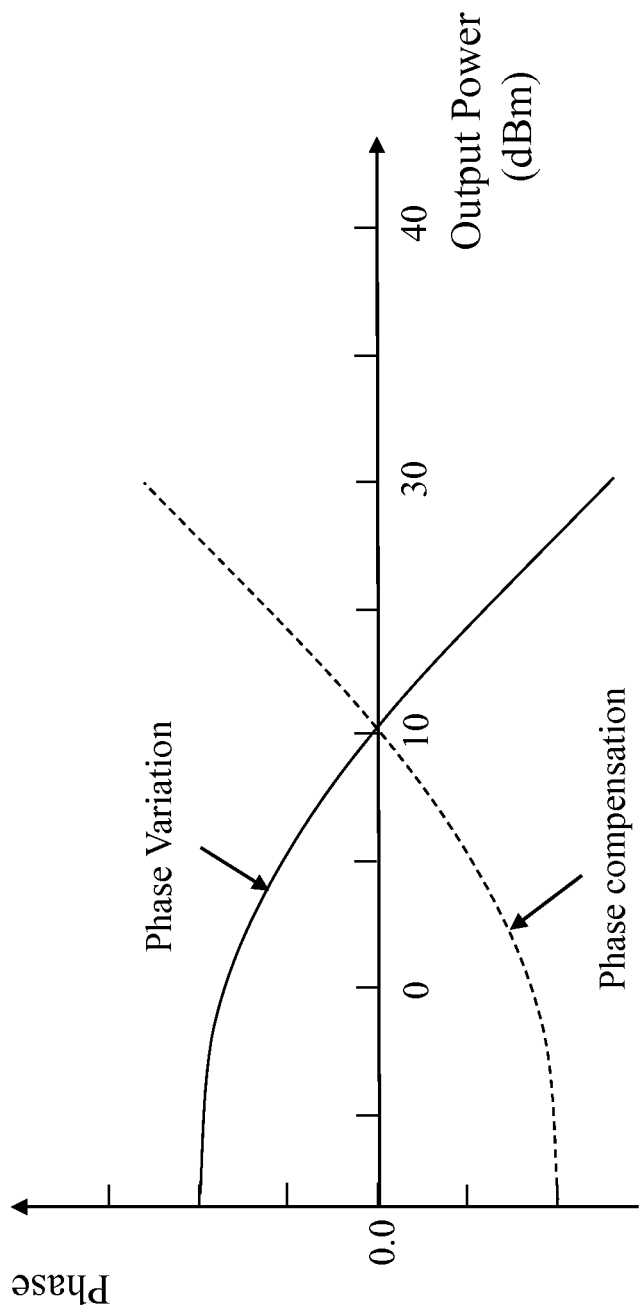
FIG. 6A illustrates an implementation of achieving linearity using phase compensation in the linear amplifier circuit of FIGS. 1A-3.
Figure 6B:
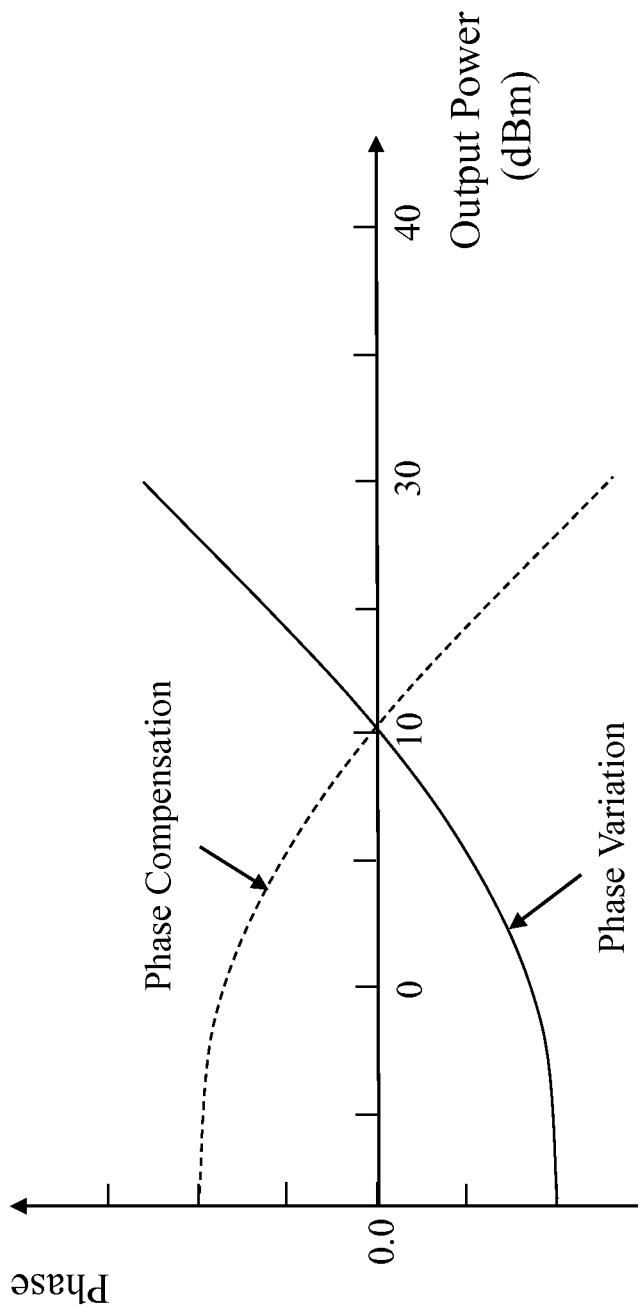
FIG. 6B illustrates another implementation of achieving linearity using phase compensation in the linear amplifier circuit of FIGS. 1A-3.

A power amplifier circuit 100A, referring to FIG. 1A, includes a matching circuit 110 and a power driving stage 115 that includes a driver amplifier (DA) 120, a gain control circuit 125, and a phase control circuit 127. The gain control circuit 125 and the phase control circuit 127 can respectively provide gain and phase controls to the driver amplifier 120. The gain control circuit 125 and the phase control circuit 127 receive control signals from a linearity controller that can be a base band processor (520 in FIG. 7 below) or a dedicated linearity control circuit. The power amplifier circuit 100A also includes a matching circuit 130, a power amplifier 140, and a matching circuit 160. The bias of the power amplifier 140 is under the control of a biasing circuit 150. The matching circuit 110 can receive an input RF signal. The matching circuit 110 can match the input impedance to the impedance of the device that provides the input signal and send an impedance matched signal to the driver amplifier 120. The driver amplifier 120 is biased by a biasing circuit 129 that can be internal in the driver amplifier 120. The driver amplifier 120 can amplify the signal from the matching circuit 110 and send a first amplified signal to the matching circuit 130. The matching circuit 130 can match the impedance of the first amplified signal and send an impedance matched signal to the power amplifier 140 that can generate a second amplified signal. The matching circuit 160 can match the impedance of the second amplified signal and produce an output signal. The driver amplifier 120, the matching circuit 130, and the power amplifier 140 together can be called a multi-stage power amplifier. As discussed below in relation to FIG. 7 and a wireless communication device 500, a sensing circuit 516 that can detect the power, the gain, and the phase of the output signal from the matching circuit 160 to produce a sensing signal. As discussed below in relation with FIGS. 5A and 5B, the gain control circuit 125 can improve gain linearity by compensating the gain expansion and compression between the driver amplifier 120 and the subsequent power amplifier 140. As shown in FIGS. 6A and 6B, the phase control circuit 127 can correct or compensate for phase variations over a range of the output power.

Figure 1B:
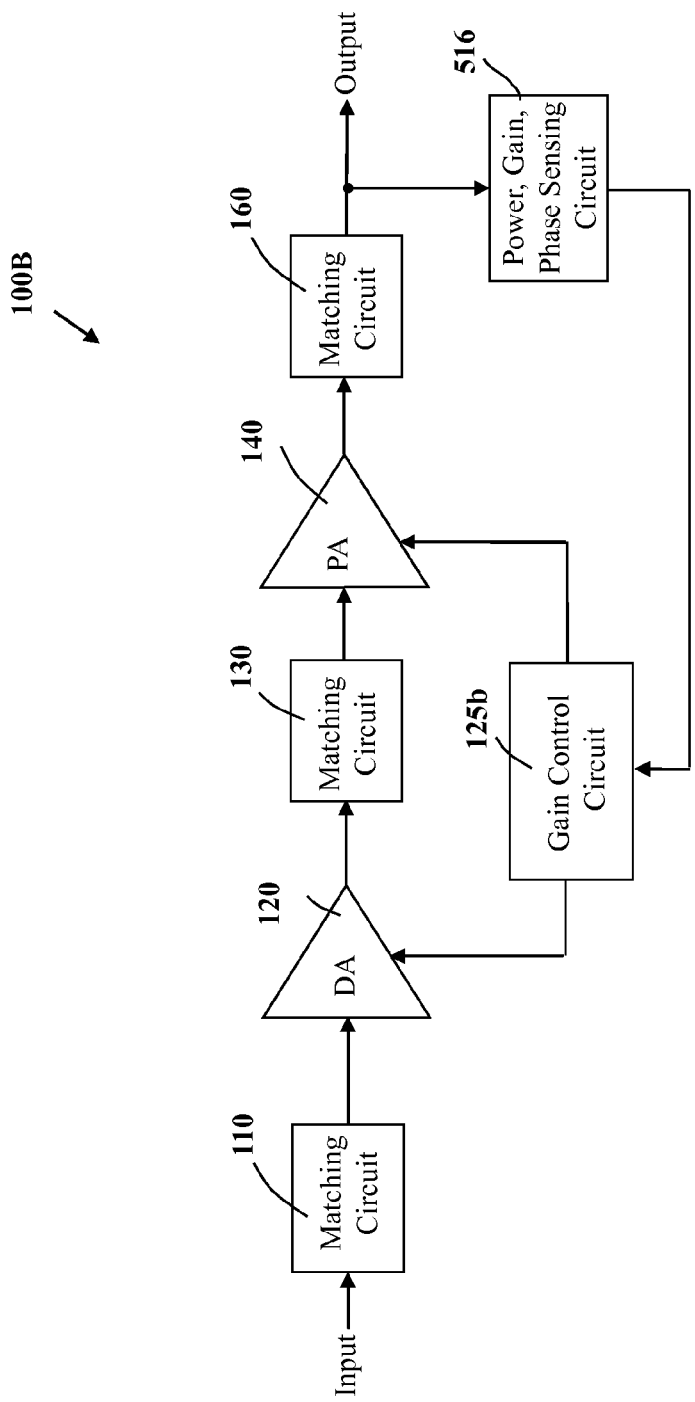

In some embodiments, referring to FIG. 1B, a power amplifier circuit 100B includes a matching circuit 110, a driver amplifier 120, a gain control circuit 125b, a power amplifier 140, a matching circuit 160, and a sensing circuit 516. The driver amplifier 120, the matching circuit 130, and the power amplifier 140 together can be called a multi-stage power amplifier. The sensing circuit 516 can detect the power, the gain, and the phase of the output signal from the matching circuit 160 to produce a sensing signal. The gain control circuit 125b can control the linearity of the power diver 120 and the power amplifier 140 in response to the sensing signal. As discussed below in relation with FIGS. 5A and 5B, the gain control circuit 125b can improve gain linearity by compensating the gain expansion and compression between the driver amplifier 120 and the power amplifier 140.

Figure 1C:
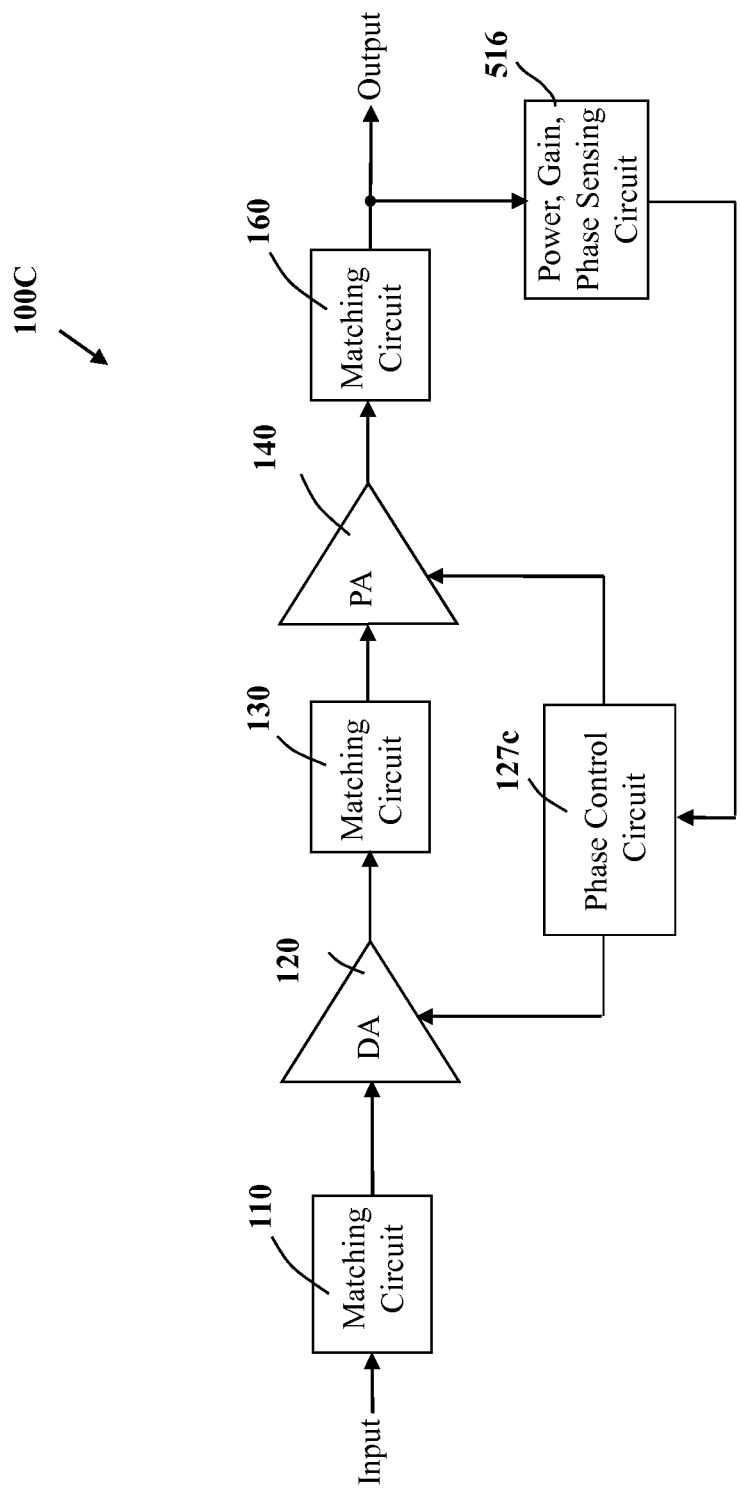

In some embodiments, referring to FIG. 1C, a power amplifier circuit 100C includes a matching circuit 110, a driver amplifier 120, a phase control circuit 127c, a power amplifier 140, a matching circuit 160, and a sensing circuit 516. The driver amplifier 120, the matching circuit 130, and the power amplifier 140 together can be called a multi-stage power amplifier. The sensing circuit 516 can detect the power, the gain, and the phase of the output signal from the matching circuit 160 to produce a sensing signal. The phase control circuit 127c can control the linearity of the power diver 120 and the power amplifier 140 in response to the sensing signal. As discussed below in relation with FIGS. 6A and 6B, the phase control circuit 127c can improve phase uniformity and linearity in the output signal by compensating the relative phase variations between the driver amplifier 120 and the power amplifier 140.

Figure 1D:
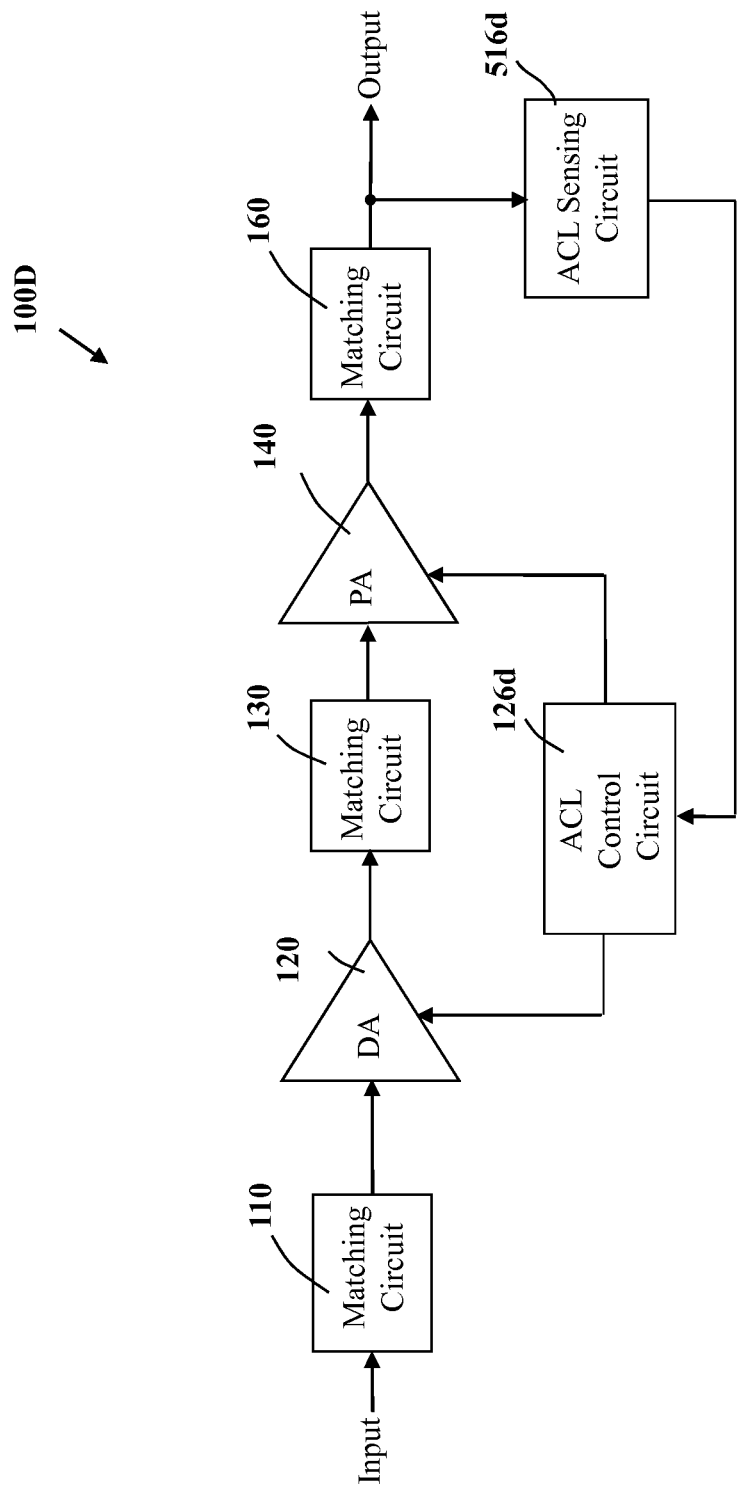

In some embodiments, referring to FIG. 1D, a power amplifier circuit 100D includes a matching circuit 110, a driver amplifier 120, an ACL control circuit 126d, a power amplifier 140, a matching circuit 160, and a sensing circuit 516. The driver amplifier 120, the matching circuit 130, and the power amplifier 140 together can be called a multi-stage power amplifier. The ACL sensing circuit 516d can detect ACL in the output signal from the matching circuit 160 to produce a sensing signal.

Figure 1E:
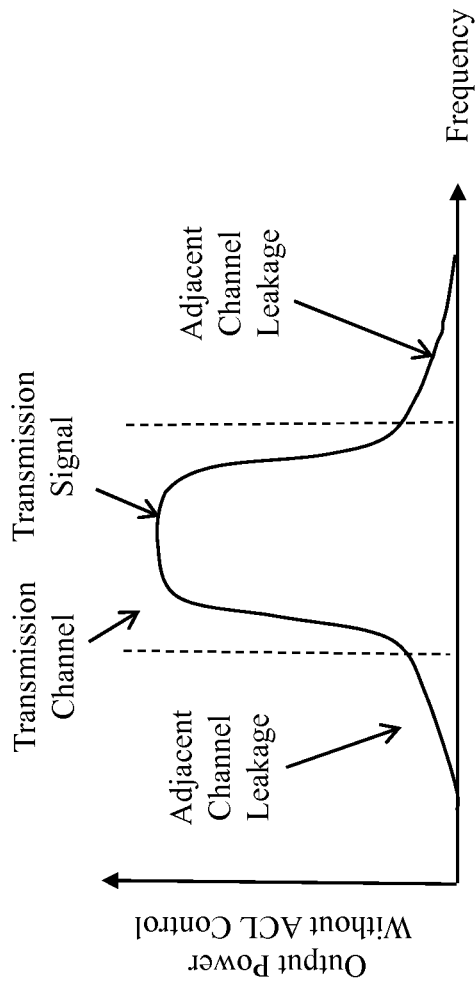
FIG. 1E illustrates the adjacent-channel leakage in an output power spectrum without ACL control.

Without the ACL control, the output signal from the power amplifier 140, shown in FIG. 1E, includes a transmission signal in a main transmission channel, accompanied by adjacent-channel leakage next to the main transmission channel. The adjacent-channel leakage is caused by non-linear modulations by the power amplifier on the transmission signals (i.e. intermodulation). The adjacent-channel leakage can cause undesirable interferences in wireless communication. The amount of adjacent-channel leakage can be measured by the ratio between the total power of the adjacent-channel leakage to the power of the transmission signals, which is called ACLR (adjacent channel leakage ratio).

Figure 1F:
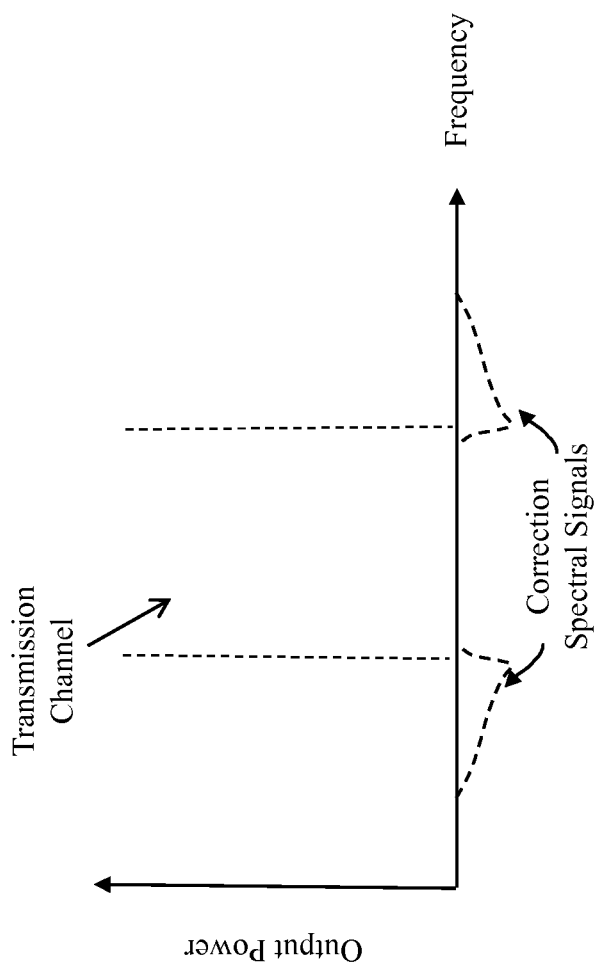
FIG. 1F illustrates correction spectral signals in an output power spectrum in accordance to the present invention.

The ACL control circuit 126d can control the power diver 120 and the power amplifier 140 in response to the sensing signal. As a result, as shown in FIG. 1H, the adjacent-channel leakage is significantly reduced in the output signals over a wide power range with linearity control. The reduction or elimination of non-linear adjacent signals can improve the linearity performance of the output signal.

Figure 1G:
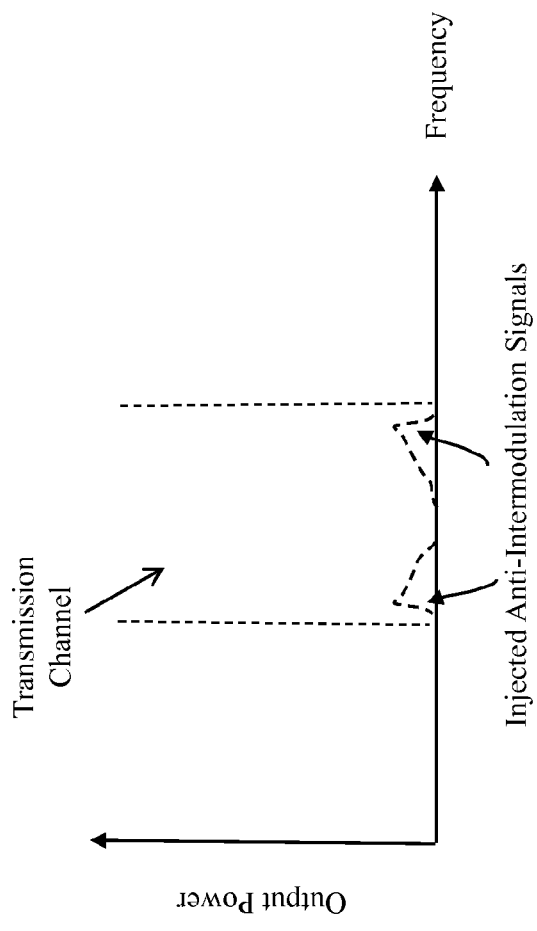
FIG. 1G illustrates injected anti-intermodulation signals within the transmission channel in accordance to the present invention.
Figure 1H:
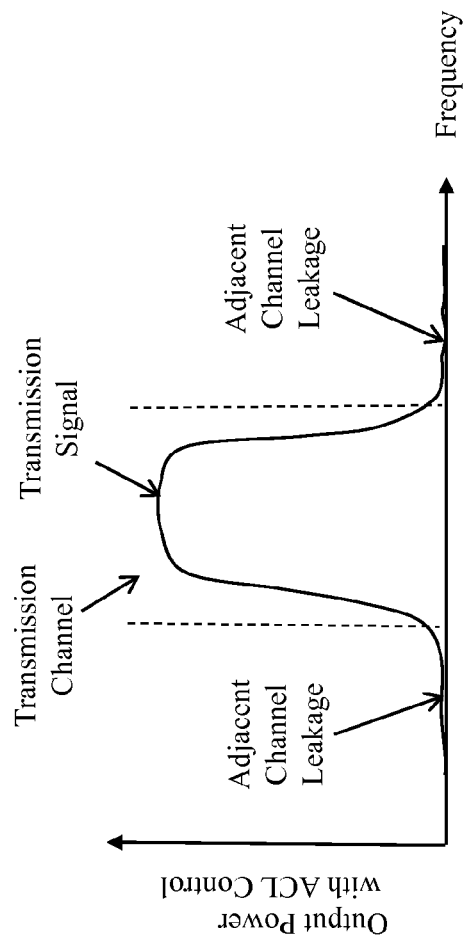
FIG. 1H illustrates reduced adjacent-channel leakage in an output power spectrum with ACL control in accordance to the present invention.
Figure 1I:
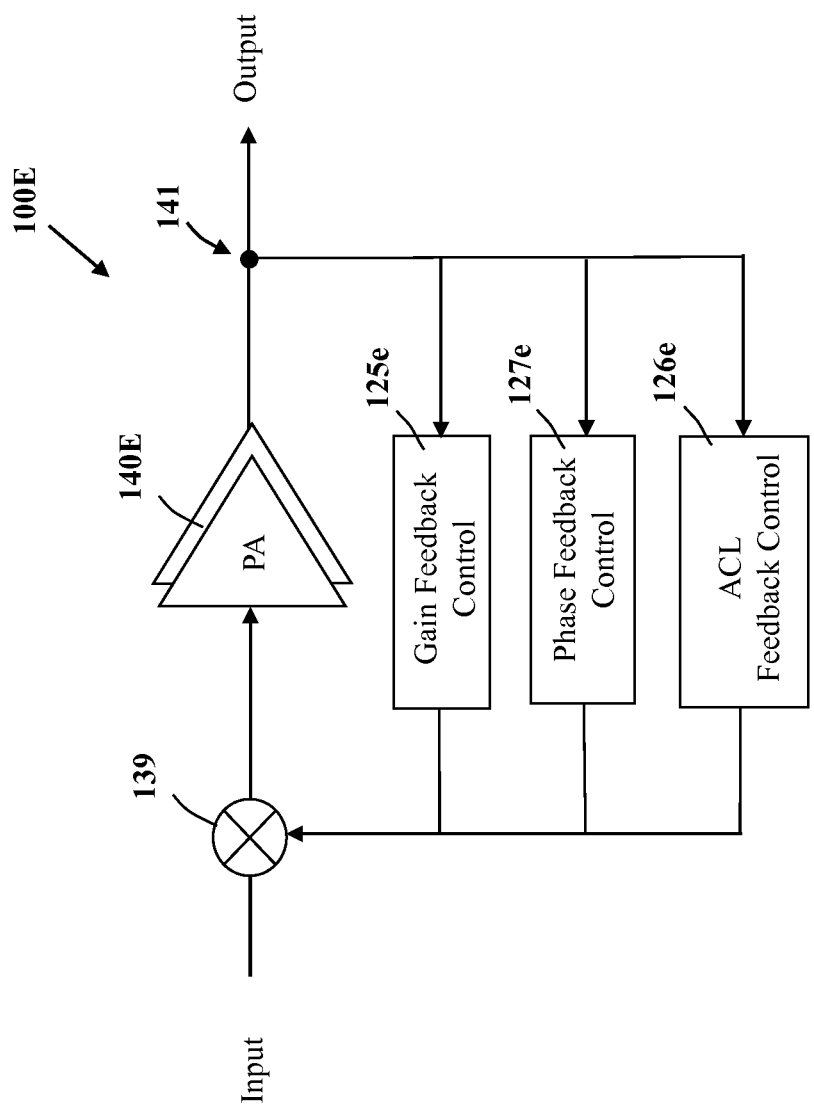
FIG. 1I is a detailed schematic diagram showing feedback controls for a power amplifier compatible with the power amplifier circuits with linearity controls in accordance to the present invention.

In some embodiments, referring to FIG. 1I, a detailed schematic diagram shows a circuit 100E that includes feedback controls for a multistage power amplifier 140E. The multistage power amplifier 140E can include two or more serially connected power amplifiers coupled in between with an inter-stage matching circuit. The circuit 100E is compatible with the power amplifier circuits 100A-100D, 200, and 300 for linearity controls. The circuit 100E can include one or more of a gain feedback control circuit 125e, a phase feedback control circuit 127e, and an ACL feedback control circuit 126e. The gain feedback control circuit 125e can detect the output of the multistage power amplifier 140E at an output node 141, and send a gain feedback signal to an input node 139, which improves the gain linearity of the multistage power amplifier 140E. The phase feedback control circuit 127e can detect the output of the multistage power amplifier 140E at the output node 141, and send a phase feedback signal to the input node 139, which improves the phase linearity of the multistage power amplifier 140E. The ACL feedback control circuit 126e can detect the output of the multistage power amplifier 140E at the output node 141, and send an ACL feedback signal to the input node 139, which reduces adjacent-channel leakage in the output of the multistage power amplifier 140E, as illustrated in FIGS. 1E-1H. The reduction or elimination of non-linear adjacent-channel leakage can improve the linearity performance of the output signal.

In the present invention, the gain feedback control circuits 125, 125b, 125e (225, 325), the phase feedback control circuit 127, 127c. 127e (and 227 and 327), and the ACL control circuit 126d, 126e can be referred to as "linearity control circuits". The linearity control circuits can receive sensing signals produced by a sensing circuit in response to the output signal as feedback. The linearity control circuits can control a power amplifier, a driver amplifier in different amplification stages (and other power amplifiers in parallel) to improve linearity, and reduce variations in gain, phase, and power of the output signals over a wide power range.

Figure 1J:
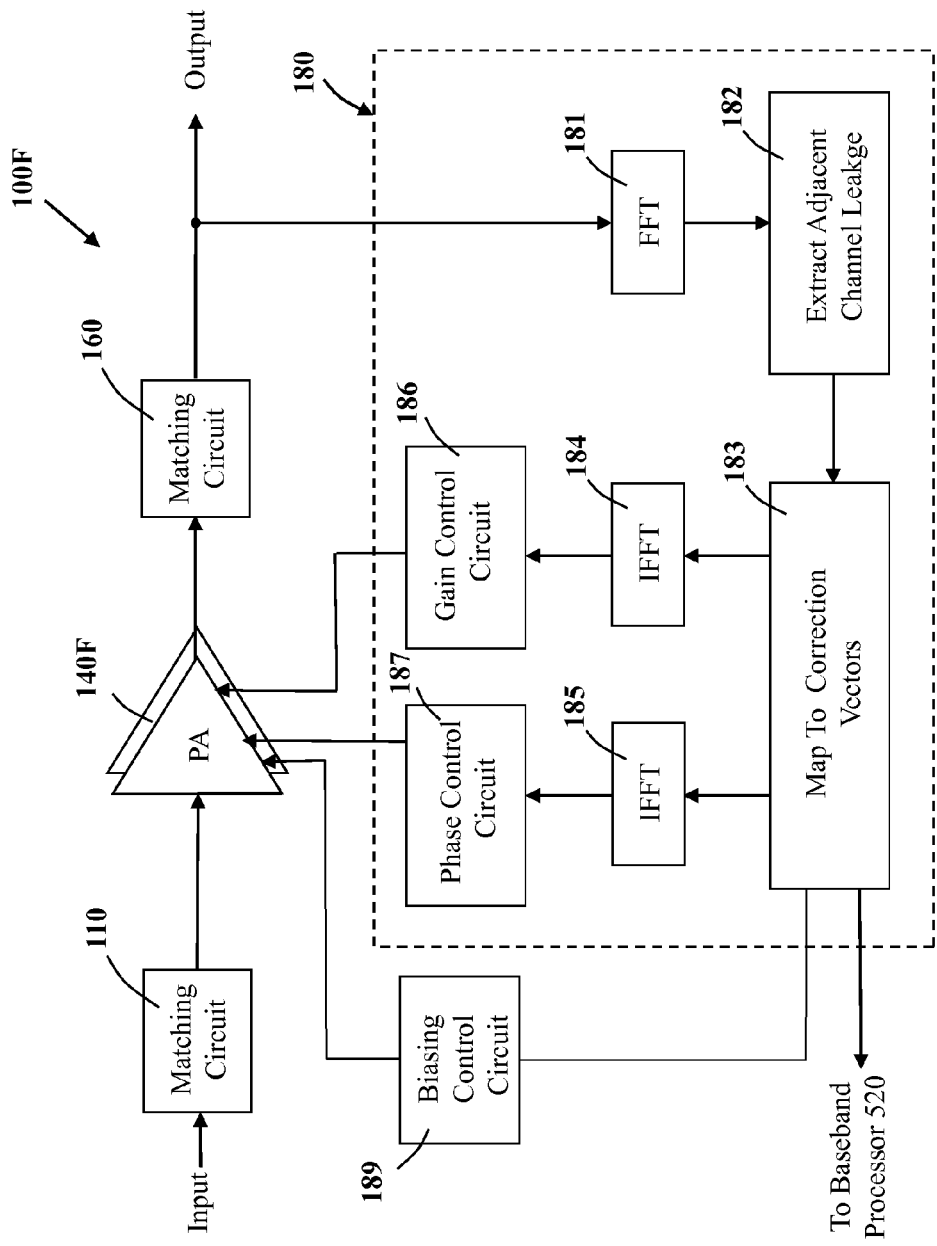
FIG. 1J is a detailed schematic diagram showing feedback controls for a power amplifier compatible with the power amplifier circuits with linearity controls in accordance to the present invention.

Referring to FIG. 1J, a power amplifier circuit 100F includes a matching circuit 110, a multistage power amplifier 140F, a matching circuit 160, and a linearity control circuit 180. The multistage power amplifier 140F can include two or more serially connected power amplifiers coupled in between with an inter-stage matching circuit. The linearity control circuit 180 includes circuits 181-187 configured to reduce adjacent-channel leakage in the output signal over a wide power range using a feedback mechanism.

The circuit 181 is configured to apply fast Fourier transform (FFT) to the output signal and to produce a spectral signal, which includes a transmission signal and undesirable adjacent-channel leakage due to the intermodulation of the transmission signal. The circuit 182 is configured to extract adjacent-channel leakage besides the transmission signal in the FFT signal. The circuit 183 is configured to map the adjacent-channel leakage to produce correction spectral signals for purpose of reducing ACL. The circuit 184 is configured to conduct an inverse fast Fourier transform (IFFT) of the correction spectral signal to produce a gain correction signal. The gain control circuit 186 is configured to produce a gain control signal to correct the adjacent-channel leakage in response the output of the circuit 184. The circuit 185 is also configured to conduct an inverse fast Fourier transform (IFFT) of the correction spectral signal to produce a phase correction signal. The phase control circuit 187 is configured to produce a phase control signal to correct the adjacent-channel leakage in response the output of the circuit. As a result, adjacent-channel leakage (as shown in FIG. 1H) is reduced in the output signal.

In some embodiments, the correction vectors produced by the circuit 183 can be sent to the baseband processor 520 (FIG. 7) to produce correction spectral signal in the input signal, which reduces adjacent-channel leakage. The reduction or elimination of non-linear adjacent signals can improve the linearity performance of the output signal.

In some embodiments, the correction vector produced by the circuit 183 can be sent to a biasing control circuit 189 which can control the biasing of the multistage power amplifier 140F to reduce adjacent-channel leakage.

In according to the present invention, ACL can be controlled in different approaches. In some embodiments, the ACL control circuit 126*d*, the ACL feedback control 126*e*, and the circuit 183 (in FIGS. 1D-1J) can produce correction spectral signal, as shown in FIG. 1F, to directly cancel out the ACL in the adjacent channels.

In some embodiments, the ACL control circuit 126*d*, the ACL feedback control 126*e*, and the circuit 183 (in FIGS. 1D-1J) can inject anti-intermodulation signals (AIS) in the transmission channel, as shown in FIG. 1G. The purpose of AIS is to compensate the undesirable ACL. The intermodulation of the AIS with the transmission signals can produce adjacent-channel signals that are anti-phase to ACL, and thus reducing or eliminating ACL.

In according to the present invention, ACL control can be implemented using feedback from the output signal, as shown in FIGS. 1D, 1I, and 1J. The correction signals can be dynamically computed to produce correction vector and correction signals. In some embodiments, correction signals can be pre-computed and pre-stored. The pre-stored correction signals can be applied to the power amplifiers without using closed-loop feedback from the PA output.

Figure 2:
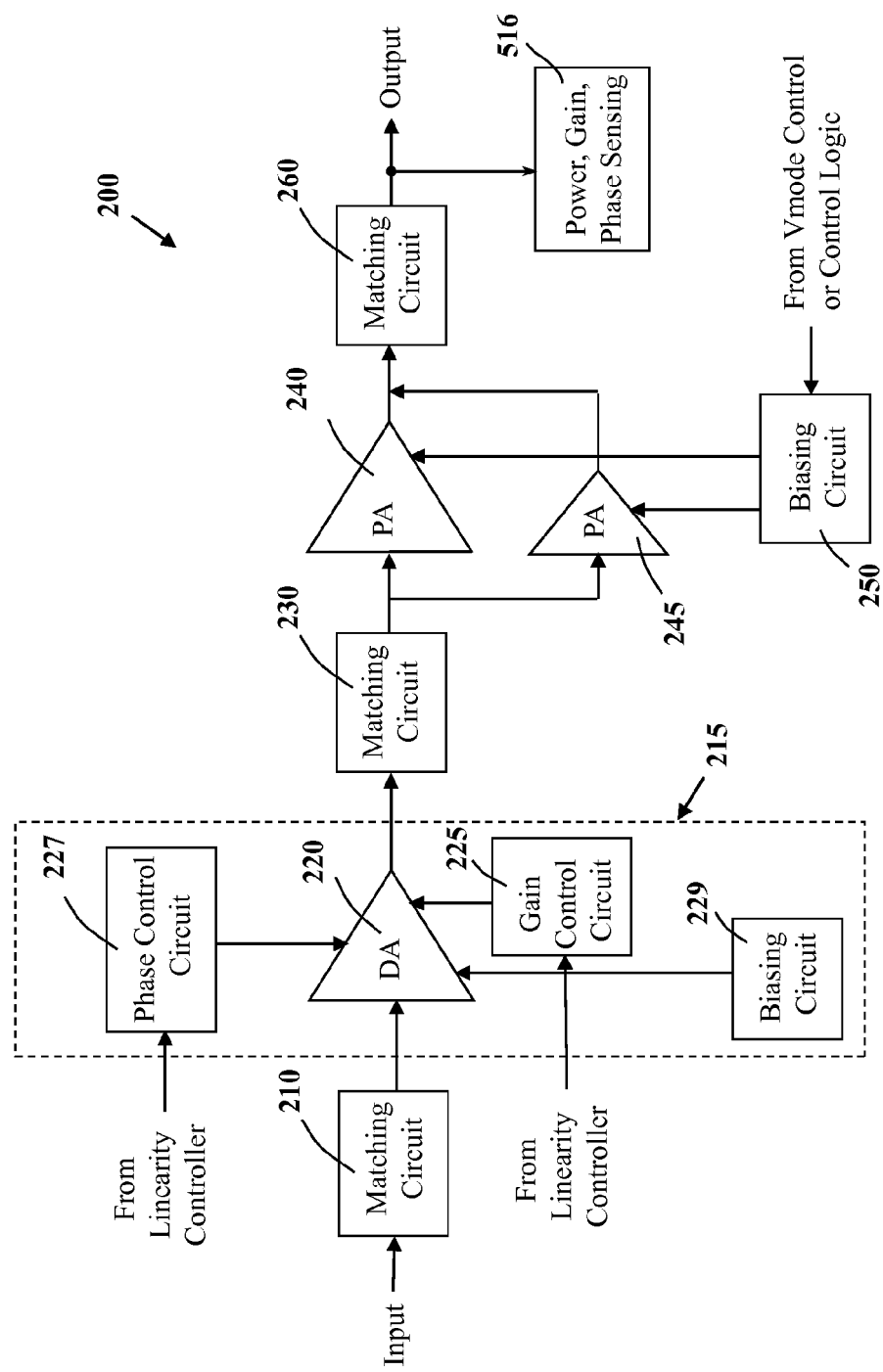
FIG. 2 is a schematic diagram for a linear amplifier circuit in accordance with the present specification.

In some embodiments, referring to FIG. 2, a linear amplifier circuit 200 includes a matching circuit 210 for the input signal and a power driving stage 215 that includes a driver amplifier 220, a gain control circuit 225, and a phase control circuit 227. The gain control circuit 225 and the phase control circuit 227 receive control signals from a linearity controller that can be a base band processor (520 in FIG. 7 below) or a dedicated linearity control circuit. The gain control circuit 225 and the phase control circuit 227 can respectively provide gain and phase controls to the driver amplifier 220. The driver amplifier 220 is controlled by a biasing circuit 229 that can be internal to the driver amplifier 220. The linear amplifier circuit 200 also includes a matching circuit 230 for a first amplified signal from the driver amplifier 220, and a matching circuit 260 for the output signal. As discussed below in relation to FIG. 7 and a wireless communication device 500, a sensing circuit 516 can receive the output signal from the matching circuit 260, which can detect the power, the gain, and the phase of the output signal for linearity control.

The linear amplifier circuit 200 also includes a main power amplifier 240 and an auxiliary power amplifier 245 which can be arranged in a parallel circuit. As discussed below in relation with FIGS. 5A and 5B, the gain control circuit 225 can improve gain linearity by compensating the gain expansion and compression between the driver amplifier 220 and the main power amplifier 240 and the auxiliary power amplifier 245. The phase control circuit 227, as shown in FIGS. 6A and 6B, can correct or compensate for phase variations over a range of the output power.

A biasing circuit 250 can provide bias voltages the main power amplifier 240 and the auxiliary power amplifier 245. The biasing circuit 250 can produce a first bias signal for the main power amplifier 240 and a second bias signal for the auxiliary power amplifier 245. The main power amplifier 240 and the auxiliary power amplifier 245 can thus be activated separately to optimize the performances (power consumption, gain linearity, noise reduction, etc.) of the wireless communication device. The biasing circuit 250 can activate the main power amplifier 240 when the power of the output signal is to exceed a first threshold value. The biasing circuit 250 can deactivate the main power amplifier 240 when the power of the output signal is to be below a first threshold value. The auxiliary power amplifier 245 can be activated by the biasing circuit 250 at least when the power of the output signal is below a second threshold value. Optionally, the auxiliary power amplifier 245 can be activated by the biasing circuit 250 when the power of the output signal is to exceed the second threshold value. The first threshold value can be the substantially the same or below the second threshold value. As described below in more detail in relation to FIG. 7, the biasing circuit 250 can be controlled by a control logic circuit and/or a Vmode control circuit. The controls can be based on the power of the output RF signal as measured by a power sensing circuit. The controls can also be determined by a base band processor 520.

The matching circuit 210 can match the impedance of the input RF signal and send an impedance matched signal to the first-stage driver amplifier 220. The driver amplifier 220 can amplify the signal from the matching circuit 210 and send a first amplified signal to the matching circuit 230. The matching circuit 230 can match the impedance of the first amplified signal and send impedance matched signals to the main power amplifier 240 and the auxiliary power amplifier 245. The main power amplifier 240 and the auxiliary power amplifier 245, as described below, can coordinate the amplification tasks to produce amplified signals to be sent to the matching circuit 260. The matching circuit 260 can match the impedance of the amplified signals from the main power amplifier 240 and the auxiliary power amplifier 245 and produce an output signal. The impedance matching of the input and output signals is preferably based on the 50-ohm standard of the RF industry. Other details of impedance matching circuits are described commonly assigned U.S. patent application Ser. No. 10/041,863, filed on Oct. 22, 2001, titled "Multilayer RF Amplifier Module", by Wang, et al., the content of which is incorporated by reference.

An advantage of the improved and efficient linear amplifier circuit 200 is that the intermediate amplified RF signal from the first-stage driver amplifier 220 is impedance matched by the matching circuit 230 before it is received by the main power amplifier 240 and the auxiliary power amplifier 245. Since the main power amplifier 240 and the auxiliary power amplifier 245 can operate with high current flowing, non-zero impedance can induce can inject unwanted voltage noise during the intermediate amplification steps in the linear amplifier circuit. The impedance matching for the intermediate signals can therefore significantly minimize noise and unwanted signal oscillations.

It should be noted that the main power amplifier 240 or the auxiliary power amplifier 245 can include multiple stages of amplifiers. Moreover, the power amplifier module 200 can include more than one auxiliary power amplifiers 245. For example, the power amplifier module 200 can include two or three auxiliary power amplifiers that are connected in parallel with the main power amplifier. The different auxiliary power amplifiers can be activated at and below different threshold power levels of the output signal. For example, the power of the output signals may include three contiguous ranges that the main power amplifier and two auxiliary power amplifiers are responsible for amplifying from the high power rage to the low power range. In some embodiments, the power amplifier module 200 is fabricated on an integrated circuit module that can be implemented on a single semiconductor chip.

Figure 3:
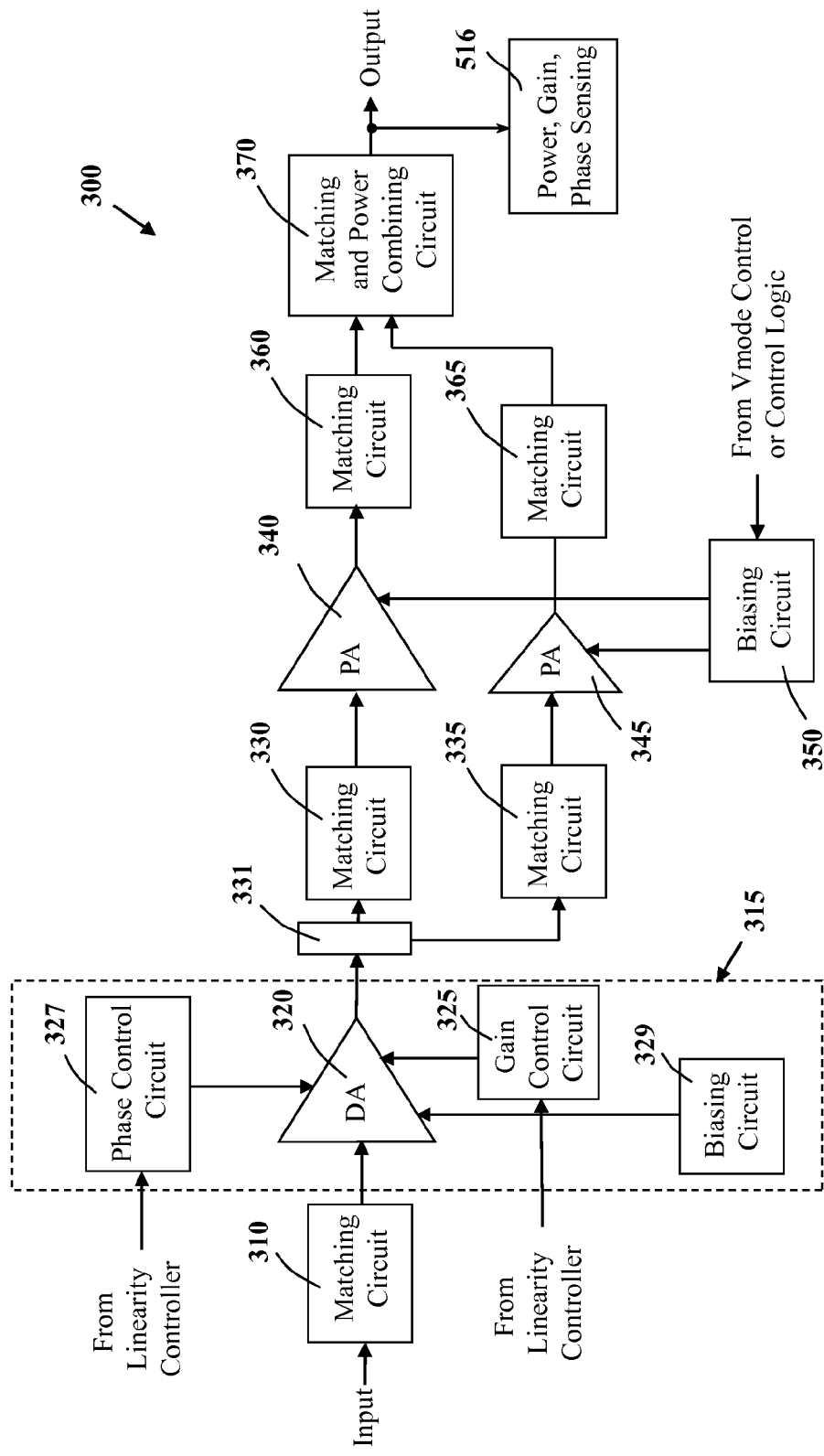
FIG. 3 is a schematic diagram for another linear amplifier circuit in accordance with the present specification.
Figure 4:
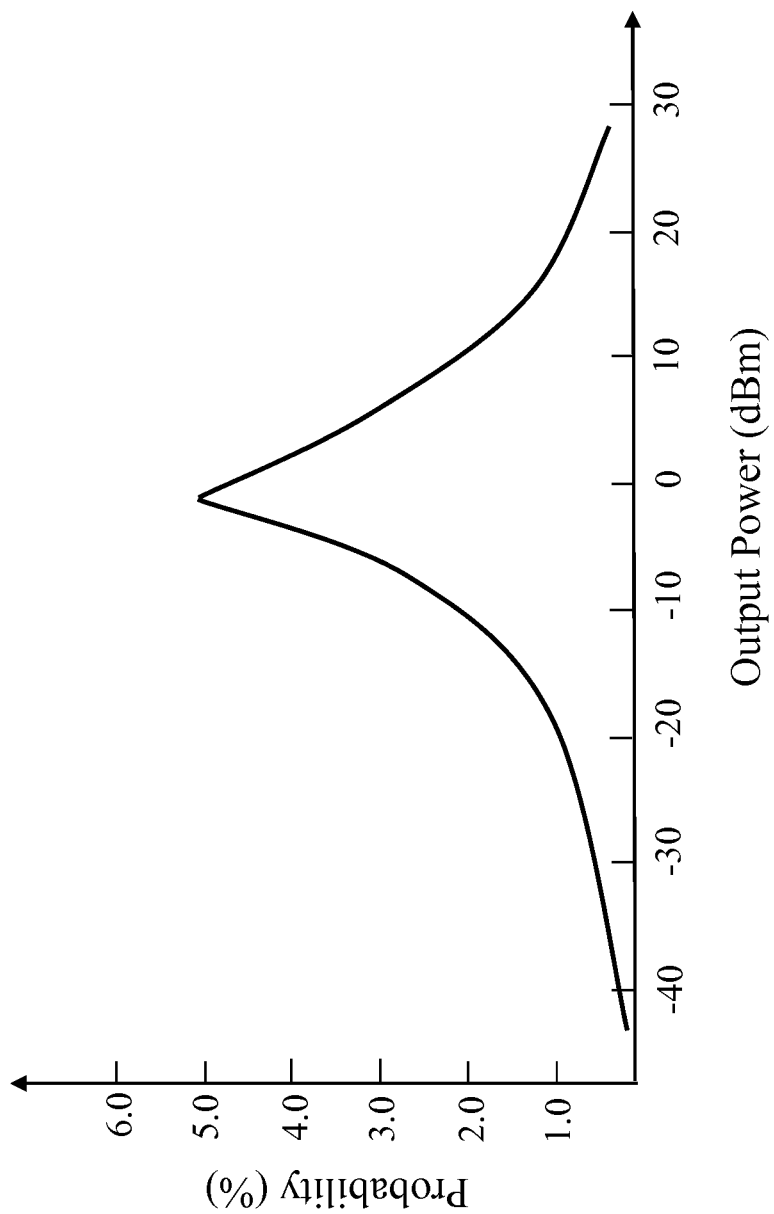
FIG. 4 shows an exemplified probability distribution for output power of a wireless communication protocol in a geographic environment.

In another implementation, an improved and efficient linear amplifier circuit 300, referring to FIG. 3, includes a matching circuit 310 for the input signal and a power driving stage 315 that includes a driver amplifier 320, a gain control circuit 325, and a phase control circuit 327. The gain control circuit 325 and the phase control circuit 327 receive control signals from a linearity controller that can be a base band processor (520 in FIG. 7 below) or a dedicated linearity control circuit. The gain control circuit 325 and the phase control circuit 327 can respectively provide gain and phase controls to the driver amplifier 320. The driver amplifier 320 is biased by a biasing circuit 329 that can be internal in the driver amplifier 320. The linear amplifier circuit 300 also includes a power divider 331, a matching circuit 330 for matching the impedance of a first power divided signal from the power divider 331, and a matching circuit 335 for matching the impedance of a second power divided signal from the power divider 331. The linear amplifier circuit 300 also includes a main power amplifier 340 and an auxiliary power amplifier 345 which can be arranged in a parallel circuit, matching circuits 360, 365 respectively for matching the amplified signals from the main power amplifier 340 and the auxiliary power amplifier 345. The main power amplifier 340 and the auxiliary power amplifier 345, as described below, can coordinate the amplification tasks. The main power amplifier 340 can amplify the output from the matching circuit 330 to produce a first amplified signal. The auxiliary power amplifier 340 can amplify the output from the matching circuit 335 to produce a second amplified signal. The matching circuit 360, 365 can respectively match the impedances of the first amplified signal and the second amplified signal. A matching and power combining circuit 370 can combine the powers and further match the impedances of the output signals from the matching circuits 360, 365. As discussed below in relation to FIG. 7 and a wireless communication device 500, a sensing circuit 516 can receive the output signal from the matching circuit 370, which can detect the power, the gain, and the phase of the output signal for linearity control.

As discussed below in relation with FIGS. 5A and 5B, the gain control circuit 325 can improve gain linearity by compensating the gain expansion and compression between the driver amplifier 320 and the main power amplifier 340 and the auxiliary power amplifier 345. The gain control circuit 325 can correct or compensate for phase variations over a range of the output power.

The impedance matching of the input and output signals is preferably based on the 50-ohm standard of the RF industry. Other details of impedance matching circuits are described commonly assigned U.S. patent application Ser. No. 10/041, 863, filed on Oct. 22, 2001, titled "Multilayer RF Amplifier Module", by Wang, et al., the content of which is incorporated by reference.

A biasing circuit 350 can provide bias voltages the main power amplifier 340 and the auxiliary power amplifier 345. As described below in more detail in relation to FIG. 7, the biasing circuit 350 can be controlled by a control logic circuit and/or a Vmode control circuit. The controls can be determined by the power of the output RF signal as sensed by a power sensing circuit, or by a base band processor.

An advantage of the improved and efficient linear amplifier circuit 300 is that it includes separate impedance matching for the intermediate signals before and after the main power amplifier 340 and the auxiliary power amplifier 345. A separate matching circuit is provided to match the impedance of the output RF signal. A power divider is provided to properly distribute power to the main power amplifier 340 and the auxiliary power amplifier 345. Since the main power amplifier 340 and the auxiliary power amplifier 345 can operate with high current flowing, non-zero impedance can induce can inject unwanted voltage noise during the intermediate amplification steps in the linear amplifier circuit. The impedance matching for the intermediate signals can therefore significantly minimize noise and unwanted signal oscillations.

It should be noted that the main power amplifier 340 and the auxiliary power amplifier 345 can include multiple stages of amplifiers. Moreover, the power amplifier module 300 can include more than one auxiliary power amplifiers 345. For example, the power amplifier module 300 can include two or three auxiliary power amplifiers that are connected in parallel with the main power amplifier. The different auxiliary power amplifiers can be activated at and below different threshold power levels of the output signal. In some embodiments, the power amplifier module 300 is fabricated on an integrated circuit module that can be implemented on a single semiconductor chip. In some embodiments, the power amplifier module 300 is fabricated on an integrated circuit module that can be implemented on a single semiconductor chip.

In accordance with the present specification, the main power amplifier (e.g. 240 or 340) and the auxiliary power amplifier (e.g. 245 or 345) can be fabricated and controlled in accordance to the probability distribution of the output power in wireless communication devices that incorporates the linear amplifier circuit (e.g. 200 or 300). FIG. 3 illustrates an exemplified probability distribution for output power of a wireless communication protocol in a geographic environment. The probability for output power is peaked at a certain output power value and falls off above and below the peak output power. The exact value of the peak output power and the shape of the fall-off curves depend on the wireless communication protocol as well as the geographic environment such as an urban area or a rural area.

The main power amplifier (e.g. 240 or 340) can be fabricated in large dimensions such that it can handle the amplification of high power output. The auxiliary power amplifier (e.g. 245 or 345) on the other hand can be fabricated in smaller dimensions to allow it to handle the amplification of low power signals. The main power amplifier (e.g. 240 or 340) can be activated by the biasing circuit (e.g. 250 or 350) when the output signal is at high power. The auxiliary power amplifier (e.g. 245 or 345) can be activated by the biasing circuit (e.g. 250 or 350) when the output signal is at low power. The output power, as described above and more in detail below, can be measured by a power sensing circuit. The power sensing signal produced by the power sensing circuit can be directly fed to control the biasing circuit, or to a base band processor that can determine the proper control to biasing circuit based on the calculation of the power level and other quality factors of the output RF signal.

The auxiliary power amplifier (e.g. 245 or 345) generally consumes much less power than the main power amplifier (e.g. 240 or 340). Because the main power amplifier (e.g. 240 or 340) can be turned off when the output power is at low level, the power consumption can be significantly decreased for the wireless communication device.

In accordance with the present specification, the main power amplifier (e.g. 240 or 340) and the auxiliary power amplifier (e.g. 245 or 345) can be fabricated to optimize power management performance specific to the geographic environment. For example, if a wireless communication device such as a cellular phone is to be used in the Asian market, the functionalities of the main power amplifier (e.g. 240 or 340) and the auxiliary power amplifier (e.g. 245 or 345) can be tailored to the specific probability distribution for output power in the Asian market. For example, if a geographic market includes higher density of wireless transmission base stations which requires of lower output power, the main power amplifier can be tailored to smaller dimensions. The geographic markets can also include suburban versus urban applications. For example, the main power amplifier and the auxiliary power amplifier can be fabricated with a size ratio in a range between 1:1 and 100:1, such as approximately 7:1, which can cover power ranges differing by about 5 dB.

In some embodiments, the disclosed linear power amplifying circuits 100A-100E, 200, and 300 can improve gain linearity using gain compensation. Referring to FIGS. 1-3 and 5A, the driver amplifier 120, 220, or 320 can perform gain expansion. The power amplifier 140, or the main power amplifier 240 or 340 and the auxiliary power amplifier 245 (or 345) can perform gain compression. The combined effects of the gain expansion and gain compression allow the linear amplifier circuit 100A-100E, 200, or 300 to achieve gain linearity over a wide range of output power. Alternately, referring to FIGS. 1-3 and 5B, the driver amplifier 120, 220 or 320 can perform gain compression. The power amplifier 140, or the main power amplifier 240 or 340 and the auxiliary power amplifier 245 or 345 can perform gain expansion. The combined effects of the gain expansion and gain compression allow the linear amplifier circuit 100A-100E, 200 or 300 to achieve gain linearity over a wide range of output power.

In some embodiments, the disclosed linear power amplifying circuit 100A-100E, 200, and 300 can improve gain linearity using phase compensation or correction. Referring to FIGS. 1-3 and 6A, the phase of the amplified signal of the power amplifying circuit 100A-100E, 200, and 300 can vary over a range of the output power. Specifically the phase is shown to decrease with an increase in the output power. The phase control circuits 127, 127c, 127e, 227, and 327 can produce phase-compensation signals that increase with the output power. The phase-compensation signals are respectively sent to the driver amplifier 120, 220, or 320 to compensate the phase variations. Similarly, referring to FIG. 6B, the phase of the amplified signal of the power amplifying circuit 100A-100E, 200, and 300 can increase with an increase in the output power. The phase control circuits 127, 127c, 127e, 227, and 327 can produce phase compensation signals that decrease with the output power. The phase compensation signals are respectively sent to the driver amplifier 120, 220, or 320 to compensate the phase variations.

In some embodiments, the phase of the amplified signal from the power amplifying circuits 100A-100E, 200, and 300 can both increase and decrease as a function of the output power. Phase compensation can be generated to dynamically compensate over each segment of the output power. The phase compensation can be dependent on the magnitude, the polarity, and the rate of change in the phase variations.

The power amplifier 140, or the main power amplifier 240 or 340 and the auxiliary power amplifier 245 (or 345) can perform gain compression. The combined effects of the gain expansion and gain compression allow the linear amplifier circuit 100A-100E, 200, or 300 to achieve gain linearity over a wide range of output power. Alternately, referring to FIGS. 1-3, and 5B, the driver amplifier 120, 220 or 320 can perform gain compression. The power amplifier 140, or the main power amplifier 240 or 340 and the auxiliary power amplifier 245 or 345 can perform gain expansion. The combined effects of the gain expansion and gain compression allow the linear amplifier circuit 100A-100E, 200 or 300 to achieve gain linearity over a wide range of output power.

Figure 7:
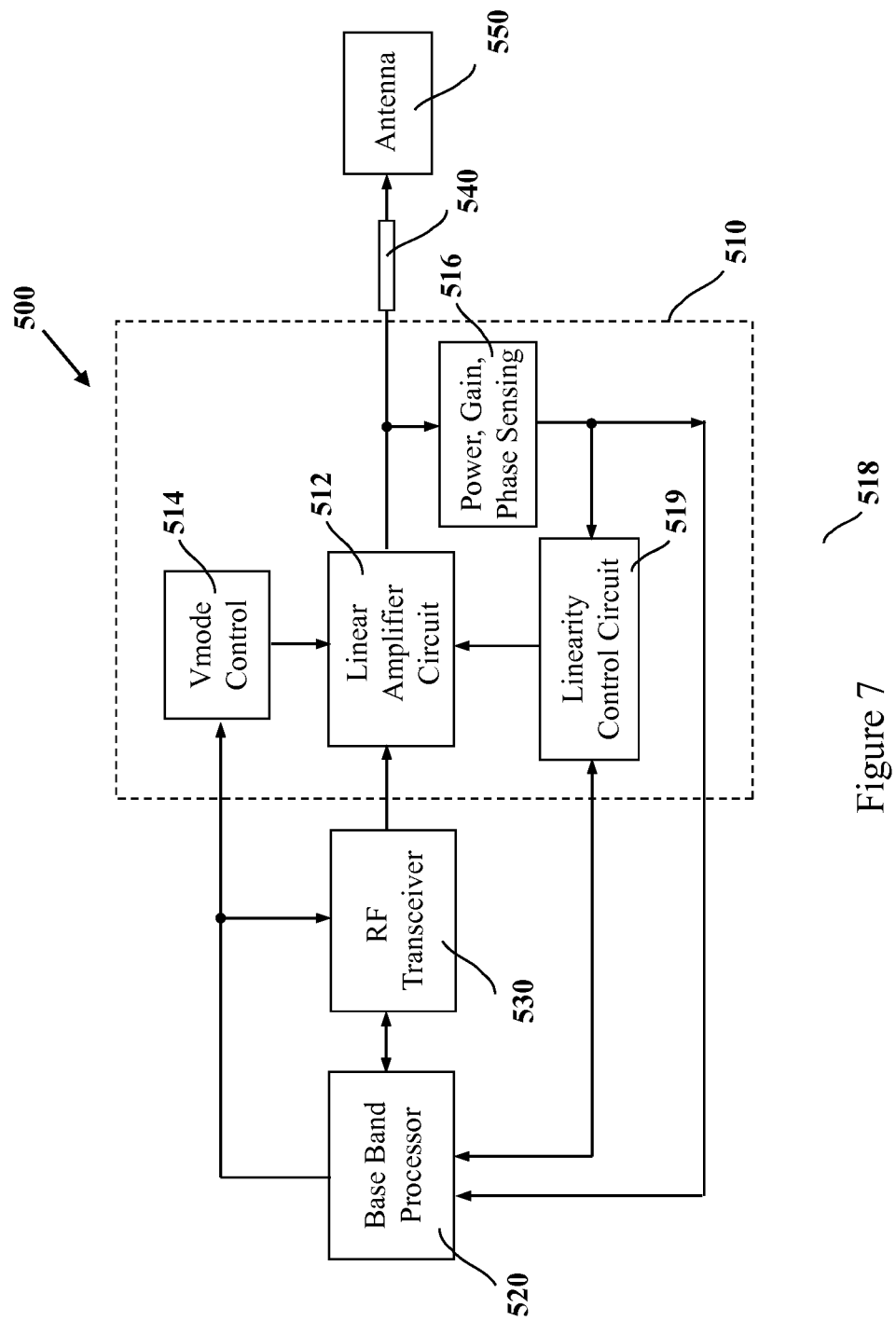
FIG. 7 illustrates an exemplified implementation of the efficient linear amplifier circuit in a wireless communication device in accordance with the present specification.

FIG. 7 illustrates an exemplary application of a linear amplifier circuit 512 in a wireless communication device 500. The wireless communication device 500 can for example be a PDA, a WLAN adaptor, or a cellular phone. The linear amplifier circuit 512 can be implemented by the linear amplifier circuit 200 or 300 as previously described. The wireless communication device 500 can include a base band processor core 520, an RF transceivers 530, a power amplifier module 510, and a 50-ohm impedance transmission line or micro strip 540 and an antenna 550. The power amplifier module 510 can include the linear amplifier circuit 512, a Vmode control circuit 514, a sensing circuit 516 for detecting the power, the gain, and the phase of the output signal, and a linearity control circuit 519. The power amplifier module 510 can therefore amplify input RF signals by via close-loop control. In some embodiments, the power amplifier module 510 is fabricated on an integrated circuit module that can be implemented on a single semiconductor chip.

The base band processor 520 can generates digitally modulated signals. The frequency is up-converted by the RF transceiver 530 to a RF signal suitable for transmission. The RF signal is amplified by the PA module 510 that produces amplified RF signal for transmission by the antenna 550. The linearity amplifier circuit 512 can be controlled by the linearity control circuit 519 to improve gain and phase linearity and to reduce adjacent-channel leakage.

In some embodiments, the linear amplifier circuit 512 can be controlled by an open loop by the base band processor 520 via Vmode control circuit 514. The Vmode control circuit 514 can produce a Vmode control signal to control and internal settings of the biasing circuits (e.g. 250 or 350) under the control of the base band processor 520. The base band processor 520 has the knowledge of the digital signal modulation type and the linear output requirement. For example, when the device is transmitting at high power, the Vmode control signal can control the biasing circuit to activate the main power amplifier. When the device is transmitting at low power, the Vmode control signal can control the biasing circuit to activate the auxiliary power amplifier. As a result, power consumption and output distortion can be minimized.

To provide excellent output linearity, a power amplifier must maintain a constant gain (which is defined as the ratio of the output signal power level to the input signal power level) over a wide output range. However, the power amplifier can be driven close to saturation at high output power level, which makes it difficult to maintain a constant gain. The quality of digital communication, especially the quality degrades at high output power level, can commonly be measured by Error Vector Magnitude (EVM), Bit Error Rate (BER), Packet Error Rate (PER), and ACLR.

In some embodiments, the linear amplifier circuit 512 can be controlled by a close loop by the power sensing circuit 516. The output linearity can be improved by a feedback control based on the sensing of the output power level. The power sensing circuit 516 can measure the power of the output RF signal and send a power sensing signal to the base band processor 520. The base band processor 520 can set the power level of the input signal to the RF transceiver 530 in accordance to the power sensing signal, wherein the dynamically adjusted input signal is in turn input to the PA module 510. The linearity control circuit 519 can process the power-sensing signal from the power sensing circuit 516 and compute a quality or a magnitude of the output signal. The linear amplifier circuit 512 is then controlled in response to the quality, or the magnitude, or a combination thereof, of the output signal.

The linearity control circuit 519 can receive and process the power-sensing control signal, and output a processed power-sensing control signal to control the linear amplifier circuit 512. The processed power-sensing control signal can be a function of the quality and/or the magnitude of the amplified radio frequency signals from the linear amplifier circuit 512. The linearity control circuit 519 can improve output linearity of the linear amplifier circuit 512 by adjusting the bias of the biasing circuits (e.g. 250 or 350) in accordance to the actual output power measured by the power sensing circuit 516. It can reduce gain saturation and maintain a more constant gain, which can improve the output linearity over a wide power range. Furthermore, the quality of digital communication can also be improved by an external controller that can adjust the amplitude of the input RF signal based the known relationship between digital communication quality and output power level.

In some embodiments, as mentioned in the discussion above in relation to FIG. 1J, the base band processor can receive a correction vector signal from the linear amplifier circuit 512. The base band processor 520 can digitally process the input signal in response to the correction vector signal to ultimately reduce adjacent-channel leakage in the output amplified signal. Similarly, the base band processor 520 can digitally process the input signal using input from the linearity control circuit 519 to improve reduce gain and phase variations in the output signals.

The PA module 510 can be implemented as an integrated circuit on a common semiconductor substrate which can be a multiplayer printed circuit board, lead frame, lower-temperature co-fired ceramics (LTCC), or other suitable electronic materials. The substrate includes metal Pins adapted to receive connecting terminals of integrated circuits including the first stage power amplifier, the main and the auxiliary power amplifiers, the biasing circuit, power sensing circuit, Vmode control circuit, and optional control logic circuit. The amplifier IC chip can include electrically conductive layers and patches for proper grounding and cooling of the PA module 510.

The PA module provides a unitary or common component which may be conveniently assembled in a RF transmission device, with correspondingly simplified assembly, compact 3D size, and enhanced RF amplification performance. In accordance with the present invention, the term "module" refers to such a unitary device for wireless communications, comprising integrated power amplifiers and other circuitry and auxiliary electronic components. The disclosed PA module can be applied to a wide range wireless communication devices such as cellular phone, mobile computers, and hand-held wireless digital devices. The PA module has a miniature size of a few millimeters.

It is understood the disclosed linear amplifier circuits can be compatible with other variations without deviating from the spirit of the present application. For example, each power amplifier in the linear amplifier circuit can include more than three or more power amplifiers having different gain factors for amplifying RF signals in different output power ranges. Three or more power amplifiers can be arranged in a parallel circuit after a first-stage power amplifier. The linear amplifier circuit can include one, or two, or more stages of power amplification. The gain and phase response curves and the output power ranges shown in disclosed figures are meant to be illustration purposes. The disclosed systems and methods are suitable to other gain and phase response characteristics in different power ranges.

The disclosed linear amplifier circuits are suitable to applications in various wireless data and voice communications standards and protocols, including Orthogonal Frequency-Division Multiplexing (OFDM), Orthogonal Frequency-Division Multiplexing Access (OFDMA), Code Division Multiple Access (CDMA), Wideband Code Division Multiple Access (WCDMA), High-Speed Downlink Packet Access (HSDPA), High-Speed Packet Access (HSPA), Ultra Mobile Broadband (UMB), Long Term Evolution (LTE), WiMax, WiBro, WiFi, WLAN, 802.16, and others. The disclosed linear amplifier circuits are also suitable for high frequency operations by utilizing Gallium Arsenide Heterojunction Bipolar Transistors (GaAs HBT).

What is claimed is:

1. A single chip amplifier circuit comprising:
   a single chip consisting of:
   a multi-stage power amplifier configured to amplify an input signal to produce an output signal;
   a sensing circuit configured to detect adjacent-channel leakage (ACL) of the output signal and to produce a sensing signal; and
   a linearity control circuit configured to control the multi-stage power amplifier to reduce ACL in the output signal in response to the sensing signal.

2. The amplifier circuit of claim 1, wherein the spectrum of the output signal comprises a transmission signal in a transmission channel and ACL in an adjacent channel, wherein the linearity control circuit is configured to produce a correction spectral signal in the adjacent channel to reduce ACL.

3. The amplifier circuit of claim 1, wherein the spectrum of the output signal comprises a transmission signal in a transmission channel and ACL in an adjacent channel, wherein the linearity control circuit is configured to inject a modulated signal in the transmission channel to reduce ACL.

4. The amplifier circuit of claim 1, further comprising a biasing control circuit configured to control the biasing of the multi-stage power amplifier, wherein the linearity control circuit is configured to control the biasing control circuit to reduce ACL in the output signal.

5. The amplifier circuit of claim 4, wherein the biasing control circuit is configured to increase a biasing voltage to reduce ACL or to decrease a biasing voltage to increase efficiency.

6. The amplifier circuit of claim 1, wherein the linearity control circuit is configured to sense adjacent-channel leakage around a transmission signal in the spectrum of the output signal and to control the multi-stage power amplifier to reduce ACL in the output signal.

7. The amplifier circuit of claim 1, wherein the multi-stage power amplifier comprises a driver amplifier, a power amplifier in serial connection, and an inter-stage matching circuit coupled between the output of the driver amplifier and the input of the power amplifier.

8. The amplifier circuit of claim 7, wherein the sensing circuit is adapted to detect the ACL at the output of the driver amplifier, at the output of the inter-stage matching circuit and at the output of the power amplifier.

9. The amplifier circuit of claim 1, further comprising:
a first matching circuit connected to the input of the multi-stage power amplifier, the first matching circuit configured to send the input signal to the multi-stage power amplifier; and
a second matching circuit configured to receive the output signal from the output of the multi-stage amplifier before the output signal is output by the linear amplifier circuit, wherein the linearity control circuit is configured to receive the output signal from the output of the second matching circuit.

10. The amplifier circuit of claim 1, further comprising:
a gain feedback control circuit coupled with the output and the input of the multi-stage power amplifier, wherein the gain feedback control circuit is configured to detect the output signal at the output of the multi-stage power amplifier and control gain variations of the output signal in an output power range in response to the detected output signal.

11. The amplifier circuit of claim 1, wherein the multi-stage power amplifier comprises a driver amplifier and a power amplifier in serial connection, wherein the linearity control circuit is configured to allow gain variations of the power amplifier and gain variations of the driver amplifier to compensate each other to reduce gain variations in the output signal over an output power range in response to the sensing signal.

12. The amplifier circuit of claim 1, wherein the driver amplifier exhibits gain expansion in the output power range, and wherein the power amplifier exhibits gain compression in the output power range.

13. The amplifier circuit of claim 1, wherein the driver amplifier exhibits gain compression in the output power range, and wherein the power amplifier exhibits gain expansion over the output power range.

14. The amplifier circuit of claim 1, wherein the multi-stage power amplifier comprises a driver amplifier and a power amplifier in serial connection, wherein the linearity control circuit is configured to allow phase variations of the power amplifier and phase variations of the driver amplifier to compensate each other.

15. The amplifier circuit of claim 14, wherein the driver amplifier exhibits phase lead in the output power range, and wherein the power amplifier exhibits phase lag over the output power range.

16. The amplifier circuit of claim 14, wherein the driver amplifier exhibits phase lag in the output power range, and wherein the power amplifier exhibits phase lead over the output power range.

17. The amplifier circuit of claim 1, wherein the linearity control circuit is further configured to map the ACL.

18. The amplifier circuit of claim 1, wherein the measurement of the ACL and control of the multi-stage amplifier to reduce ACL are simultaneous.

19. The amplifier circuit of claim 1, wherein the linear control circuit measurement of the ACL is used to calculate an ACL ratio (ACLR) and the ACLR is used to control the multi-stage power amplifier.

20. A wireless communication device having a base band processor coupled to a single chip amplifier circuit comprising:
the single chip amplifier circuit consisting of:
a multi-stage power amplifier configured to amplify an input signal to produce an output signal;
a sensing circuit coupled to the base band processor and configured to detect adjacent-channel leakage (ACL) of the output signal and to produce a sensing signal; and
the base band processor configured to control the multi-stage power amplifier to reduce ACL in the output signal in response to the sensing signal.

21. A wireless communication device having a radio frequency (RF) transceiver coupled to a single chip amplifier circuit comprising:
the single chip amplifier circuit consisting of:
a multi-stage power amplifier configured to amplify an input signal to produce an output signal;
a sensing circuit coupled to the RF transceiver and configured to detect adjacent-channel leakage (ACL) of the output signal and to produce a sensing signal; and
the RF transceiver configured to control the multi-stage power amplifier to reduce ACL in the output signal in response to the sensing signal.

22. A single chip amplifier circuit comprising:
a single chip consisting of:
a first matching circuit connected to the input of a multi-stage power amplifier, the first matching circuit configured to send the input signal to the multi-stage power amplifier;
the multi-stage power amplifier configured to amplify an input signal to produce an output signal;
a second matching circuit configured to receive the output signal from the output of the multi-stage amplifier before the output signal is output by the linear amplifier circuit, wherein a linearity control circuit is configured to receive the output signal from the output of the second matching circuit;
a sensing circuit configured to detect phase, gain and adjacent-channel leakage (ACL) of the output signal and to produce a sensing signal; and
the linearity control circuit configured to control the multi-stage power amplifier to control phase and gain and reduce ACL in the output signal in response to the sensing signal.

23. A self-controlled single chip amplifier circuit comprising:
a single chip consisting of:
a multi-stage power amplifier configured to amplify an input signal to produce an output signal;
a sensing circuit configured to detect adjacent-channel leakage (ACL) of the output signal and to produce a sensing signal; and
a linearity control circuit configured to control the multi-stage power amplifier to reduce ACL in the output signal in response to the sensing signal.

* * * * *